United States Patent
Hu et al.

(10) Patent No.: US 12,363,922 B2
(45) Date of Patent: Jul. 15, 2025

(54) POLYSILICON RESISTORS, METHODS FOR MANUFACTURING THE SAME, AND SUCCESSIVE APPROXIMATION REGISTER ANALOG-TO-DIGITAL CONVERTER

(71) Applicant: Chongqing GigaChip Technology Co., Ltd., Chongqing (CN)

(72) Inventors: Rongbin Hu, Chongqing (CN); Can Zhu, Chongqing (CN); Jianan Wang, Chongqing (CN); Guangbing Chen, Chongqing (CN); Dongbing Fu, Chongqing (CN); Zhengping Zhang, Chongqing (CN); Zhou Yu, Chongqing (CN); Zhimei Yang, Chongqing (CN); Min Gong, Chongqing (CN)

(73) Assignee: Congqing GigaChip Technology Co., Ltd., Chongqing (CN)

( * ) Notice: Subject to any disclaimer, the term of this patent is extended or adjusted under 35 U.S.C. 154(b) by 196 days.

(21) Appl. No.: 18/473,288

(22) Filed: Sep. 25, 2023

(65) Prior Publication Data
US 2024/0021662 A1 Jan. 18, 2024

Related U.S. Application Data

(63) Continuation of application No. PCT/CN2021/107427, filed on Jul. 20, 2021.

(30) Foreign Application Priority Data

Jun. 18, 2021 (CN) .......................... 202110677950.8

(51) Int. Cl.
*H10D 1/47* (2025.01)
*H03M 1/06* (2006.01)
(Continued)

(52) U.S. Cl.
CPC .......... *H10D 1/474* (2025.01); *H03M 1/0612* (2013.01); *H03M 1/124* (2013.01);
(Continued)

(58) Field of Classification Search
CPC ......... H10D 1/474; H10D 1/47; H03M 1/365; H03M 1/462; H03M 1/0612; H03M 1/124; H03M 1/38
(Continued)

(56) References Cited

U.S. PATENT DOCUMENTS

| 7,951,664 B2 * | 5/2011 | Stahrenberg | H10D 1/47 438/210 |
| 10,892,771 B1 * | 1/2021 | Narula | H03M 1/0678 |

\* cited by examiner

*Primary Examiner* — Khai M Nguyen (57) ABSTRACT

The present disclosure provides a polysilicon resistor, a method for manufacturing the same, and a successive approximation register analog-to-digital converter. A polysilicon resistor includes a first silicon substrate; a first silicon oxide layer disposed on the first silicon substrate; a second silicon substrate disposed on the first silicon oxide layer, wherein an insulating isolation structure extends through the second silicon substrate and divides the second silicon substrate into a plurality of substrate isolation areas separated from each other; a second silicon oxide layer disposed on the second silicon substrate; and a polysilicon resistor layer disposed on the second silicon oxide layer, wherein the polysilicon resistor layer includes a plurality of polysilicon resistor blocks separated from each other, the plurality of polysilicon resistor blocks is arranged in one-to-one correspondence with the plurality of substrate isolation areas, and the plurality of polysilicon resistor blocks are connected in series.

14 Claims, 7 Drawing Sheets

(51) Int. Cl.
  *H03M 1/12* (2006.01)
  *H03M 1/36* (2006.01)
  *H03M 1/38* (2006.01)
  *H03M 1/46* (2006.01)
(52) U.S. Cl.
  CPC ............. *H03M 1/365* (2013.01); *H03M 1/38* (2013.01); *H03M 1/462* (2013.01); *H10D 1/47* (2025.01)
(58) Field of Classification Search
  USPC ........................................................ 341/155
  See application file for complete search history.

FIG.1

FIG.2 providing a silicon-on-insulator substrate, wherein the silicon-on-insulator substrate includes a first silicon substrate, a first silicon oxide layer, and a second silicon substrate that are sequentially stacked along a first direction ⸺ S1 forming an insulating isolation structure on the silicon-on-insulator substrate, wherein the insulating isolation structure extends through the second silicon substrate along a first direction and divides the second silicon substrate into substrate isolation areas separated from each other ⸺ S2 forming a second silicon oxide layer on the silicon-on-insulator substrate, wherein the second silicon oxide layer covers substrate isolation areas and the insulating isolation structure ⸺ S3 forming polysilicon resistor layer on second silicon oxide layer, wherein the polysilicon resistor layer includes polysilicon resistor blocks separated from each other and arranged in one-to-one correspondence with substrate isolation areas, and polysilicon resistor blocks are connected in series ⸺ S4

FIG.15 forming an isolation trench on the insulating silicon substrate, wherein the isolation trench extends through the second silicon substrate along the first direction, and the isolation trench divides the second silicon substrate into the plurality of substrate isolation areas separated from each other — S21 filling the isolation trench with an insulating material to obtain the insulating isolation structure — S22

POLYSILICON RESISTORS, METHODS FOR MANUFACTURING THE SAME, AND SUCCESSIVE APPROXIMATION REGISTER ANALOG-TO-DIGITAL CONVERTER

CROSS-REFERENCE TO RELATED APPLICATIONS

This application is a continuation application of International Patent Application No. PCT/CN2021/107427, filed on Jul. 20, 2021, the content of which is herein incorporated by reference in its entirety.

TECHNICAL FIELD

The disclosure relates to the technical field of integrated circuits, in particular to polysilicon resistors, methods for manufacturing a polysilicon resistor, and successive approximation register analog-to-digital converters.

BACKGROUND

Figure 1:
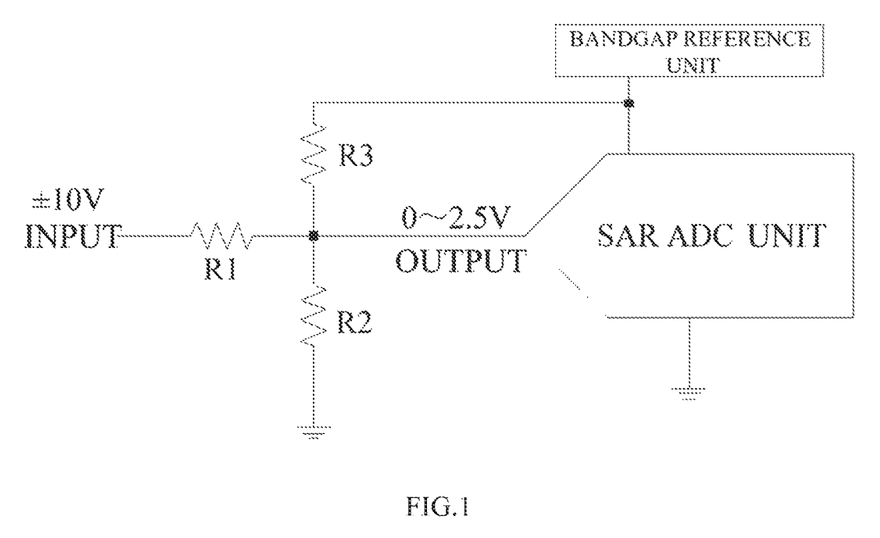
FIG. 1 is a schematic structural diagram of a successive approximation register analog-to-digital converter according to exemplary embodiments of the present disclosure.

Industrial successive approximation register analog-to-digital converters (SAR ADCs) are often required to process voltage signals ranging from −10V to +10V, or even wider signal ranges. This requires the range of the input signal of the SAR ADC to reach −10V to +10V, but the reference voltage generated by the general integrated bandgap reference circuit is 1.25V or 2.5V, and most industrial SAR ADCs use a reference voltage of 2.5V, which limits the input range of the SAR ADC signal to 0 to 2.5V. To solve this problem, a resistor voltage-divider network is generally integrated in the front end of the SAR ADC, so that the signal processing range of the SAR ADC can reach ±10V. As shown in FIG. 1, it is a typical industrial integrated SAR ADC structure diagram, which includes: a resistor voltage-divider unit having a resistor R1 and a resistor R2; a bandgap reference unit that outputs a reference voltage; and a successive approximation register analog-to-digital conversion unit (SAR ADC unit). The resistance divider unit is integrated and set at the analog front end of the SAR ADC unit, and the resistance ratio of the resistance R1 and the resistance R2 is 3:1. The resistance value of the resistance R3 and the resistance value of the resistance R2 are in the same order of magnitude. After being divided by the resistor voltage-divider unit, the signal range of −10V to +10V is only 0 to 2.5V when it reaches the front end of the SAR ADC unit. At the same time, the bandgap reference unit outputs a 2.5V reference voltage to the SAR ADC unit.

For a high-precision analog-to-digital converter such as a 16-bit SAR ADC, the linearity of the resistor voltage-divider unit is very important, which directly affects the linearity of the entire SAR ADC. At present, large semiconductor manufacturers in the world use metal thin film resistors, but metal thin film resistors require additional special process flow. However, metal thin film resistors are not used in the standard integrated circuit production process of general commercial contract manufacturers, nor can they be used by integrated circuit design manufacturers without production lines to develop high-performance SAR ADCs with more than 16 bits for industrial use.

Figure 2:
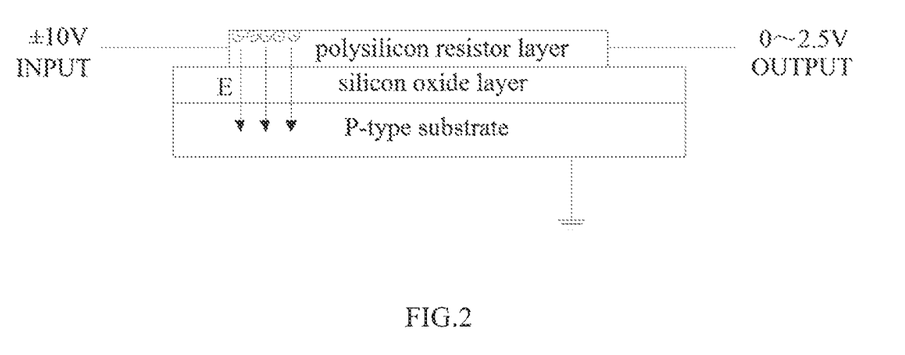
FIG. 2 is a schematic structural diagram of a polysilicon resistor according to exemplary embodiments of the present disclosure.
Figure 3:
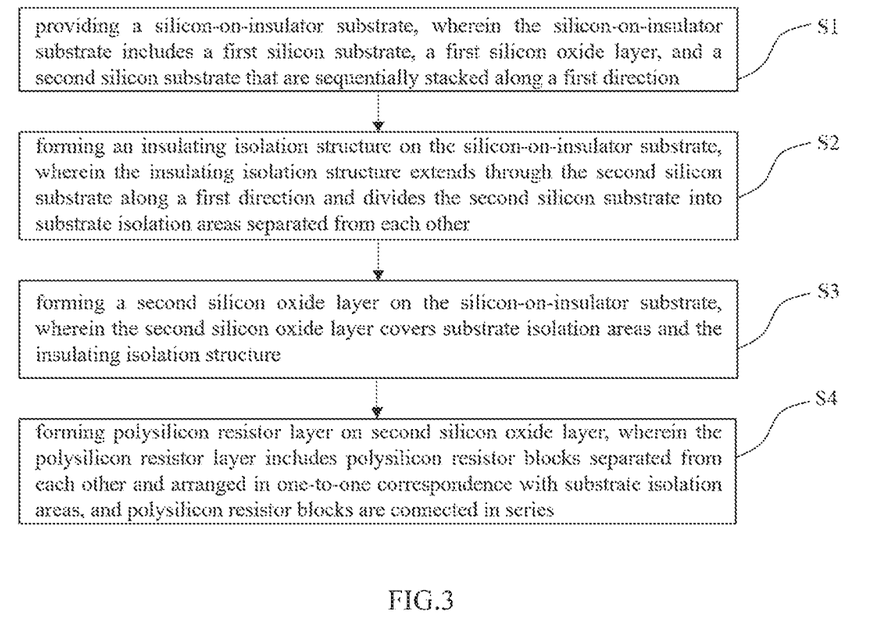
FIG. 3 is a flow chart showing the steps of a method for manufacturing a polysilicon resistor according to exemplary embodiments of the present disclosure.

Based on this, in recent years, some people have begun to try to use polysilicon resistors instead of metal film resistors to design resistor voltage-divider units. The structure of a general polysilicon resistor is shown in FIG. 2. The polysilicon resistor layer is isolated from the p-type substrate by an insulating silicon dioxide ($SiO_2$) layer, and there is a non-negligible capacitance in between. In the case of a high voltage of ±10V, a strong electric field E will be formed between the polysilicon resistor layer and the p-type substrate. The electric field will cause carriers (electrons) within the polysilicon resistive layer to induce an edge-accumulation effect, thereby causing an increase in the resistivity of the polysilicon resistive layer. At the low-voltage end (0 to 2.5V) of the polysilicon resistive layer, the electric field is weak, the edge-accumulation effect is not obvious, and the resistivity hardly increases. The inconsistency of the resistivity of the polysilicon resistive layer at the high-voltage end and the low-voltage end will cause very serious non-linearity.

In view of this, there is an urgent need for a well-linearized network technology solution for polysilicon resistor voltage-divider.

SUMMARY

In view of the above-mentioned shortcomings in the conventional technique, the purpose of the present disclosure is to provide a technical solution for the linearization of the voltage-divider network of polysilicon resistors, which is used to solve at least one of the above-mentioned technical problems.

First of all, to achieve at least one of the above purposes and other related purposes, the exemplary embodiments of the present disclosure provide a polysilicon resistor. The polysilicon resistor includes a first silicon substrate, a first silicon oxide layer disposed on the first silicon substrate, a second silicon substrate, a second silicon oxide layer, and a polysilicon resistor layer.

In some exemplary embodiments, the first silicon oxide layer is disposed on the first silicon substrate.

In some exemplary embodiments, the second silicon substrate is disposed on the first silicon oxide layer. In some exemplary embodiments, an insulating isolation structure is provided in the second silicon substrate, and the insulating isolation structure penetrates the second silicon substrate and divides the second silicon substrate into a plurality of substrate isolation areas independent from each other.

In some exemplary embodiments, the second silicon oxide layer is disposed on the second silicon substrate.

In some exemplary embodiments, the polysilicon resistor layer is disposed on the second silicon oxide layer. In some exemplary embodiments, the polysilicon resistor layer includes a plurality of polysilicon resistor blocks independent from each other, the plurality of polysilicon resistor blocks is disposed in one-to-one correspondence with the plurality of substrate isolation areas, and the plurality of polysilicon resistor blocks are connected in series.

In some exemplary embodiments, the thickness of the first silicon oxide layer is greater than the thickness of the second silicon oxide layer.

In some exemplary embodiments, a plurality of the polysilicon resistor blocks is distributed in rows, and two adjacent polysilicon resistor blocks are electrically connected.

In some exemplary embodiments, the dimensions and the sizes of the polysilicon resistor blocks are identical.

In some exemplary embodiments, the plurality of polysilicon resistor blocks is connected in series through a conductive metal to form a resistor string, and both ends of the resistor string are electrically led out through a conductive metal.

Secondly, to achieve at least one of the above purposes and other related purposes, exemplary embodiments of the present disclosure also provide a method for manufacturing a polysilicon resistor. The method includes: providing a silicon-on-insulator substrate; forming an insulating isolation structure on the silicon-on-insulator substrate; forming a second silicon oxide layer on the silicon-on-insulator substrate; and forming a polysilicon resistor layer on the second silicon oxide layer.

In some exemplary embodiments, the silicon-on-insulator substrate includes a first silicon substrate, a first silicon oxide layer, and a second silicon substrate that are sequentially stacked along a first direction.

In some exemplary embodiments, the insulating isolation structure penetrates the second silicon substrate along a first direction and divides the second silicon substrate into a plurality of substrate isolation areas independent from each other.

In some exemplary embodiments, the second silicon oxide layer covers the plurality of substrate isolation areas and the insulating isolation structure.

In some exemplary embodiments, the polysilicon resistor layer includes a plurality of polysilicon resistor blocks independent from each other, the plurality of polysilicon resistor blocks is disposed in one-to-one correspondence with the plurality of substrate isolation areas, and the plurality of polysilicon resistor blocks is connected in series.

In some exemplary embodiments, forming the insulating isolation structure on the silicon-on-insulator substrate includes: forming an isolation trench on the insulating silicon substrate, wherein the isolation trench penetrates the second silicon substrate along the first direction, and the isolation trench divides the second silicon substrate into the plurality of substrate isolation areas independent from each other; and filling the isolation trench with an insulating material to obtain the insulating isolation structure.

In some exemplary embodiments, the thickness of the second silicon oxide layer is smaller than the thickness of the first silicon oxide layer.

In some exemplary embodiments, forming the polysilicon resistor layer on the second silicon oxide layer includes: forming a doped polysilicon material layer on the second silicon oxide layer; etching the doped polysilicon material layer to obtain the plurality of polysilicon resistor blocks independent from each other, wherein the plurality of polysilicon resistor blocks is disposed in one-to-one correspondence with the plurality of substrate isolation areas; and connecting the plurality of polysilicon resistor blocks in series to form a resistor string, and electrically leading out two ends of the resistor string.

Finally, to achieve at least one of the above purposes and other related purposes, exemplary of the embodiments of the present disclosure also provide a successive approximation register analog-to-digital converter, which includes: a resistor voltage-divider unit, a bandgap reference unit, and a successive approximation register analog-to-digital conversion unit.

In some exemplary embodiments, one end of the resistor voltage-divider unit is connected to an input voltage and the other end of the resistor voltage-divider unit is grounded, and the resistor voltage-divider unit includes two polysilicon resistors arranged in series as described above, and the connecting point of the two polysilicon resistors is configured to output a sampling voltage.

In some exemplary embodiments, the bandgap reference unit is configured to output a reference voltage.

In some exemplary embodiments, the successive approximation register analog-to-digital conversion unit is connected to the resistor voltage-divider unit and the bandgap reference unit and configured to receive the sampling voltage and the reference voltage.

As mentioned above, the polysilicon resistor and its manufacturing method of the present disclosure have at least the following beneficial effects.

By utilizing the characteristics of the silicon-on-insulator (SOI) process, an upper silicon substrate layer of the silicon-on-insulator substrate is divided into several insulated and isolated substrate isolation areas, and a silicon oxide layer and a polysilicon resistor layer are sequentially formed on the upper silicon substrate layer. The polysilicon resistor layer is divided into several polysilicon resistor blocks, and several polysilicon resistor blocks are disposed on several substrate isolation areas in one-to-one correspondence so that the potential of the substrate isolation area closely follows the potential of the polysilicon resistor block. Therefore, no strong electric field can be formed between the polysilicon resistor block and the underlying substrate isolation area, effectively eliminating the carrier edge accumulation effect on the polysilicon resistors. When polysilicon resistors are applied to a front-end resistor voltage-divider network of the successive approximation register analog-to-digital converter, the linearity of the resistor voltage-divider network can be effectively improved, thereby reducing the integral nonlinearity of the successive approximation register analog-to-digital converter and improving the accuracy of the successive approximating register analog-to-digital converter.

REFERENCE NUMBERS IN FIGS

1—first silicon substrate, 2—first silicon oxide layer, 3—second silicon substrate, 301, 302, 303, 304, 305—substrate isolation areas, 4—insulating isolation structure, 5—second silicon oxide layer, 6—doped polysilicon material layer, 601, 602, 603, 604, 605—polysilicon resistor blocks, 7—conductive metal, C11, C12, C21, C22, C31, C32, C41, C42, C51, C52—capacitors, R1, R2, R3, R601, R602, R603, R604, R605—resistors, T1, T2—isolation trenches.

DETAILED DESCRIPTION

It is found that: as shown in FIGS. 1-2, in current industrial successive approximation register analog-to-digital converters, when traditional polysilicon resistors are used in the design of the voltage-divider network, a strong electric field will be formed at the high voltage end E, while the electric field at the low-voltage end is weak. As a result, an edge accumulation effect is observed in the carriers at the high-voltage end of the polysilicon resistor, and the resistivity increases. At the low-voltage end of the polysilicon resistor, the edge accumulation effect in carriers is not obvious, and the resistivity hardly increases. The inconsistency between the high-voltage end and the low-voltage end causes very serious nonlinearity, and the nonlinearity of the resistor voltage-divider network will cause the nonlinearity of the successive approximation register analog-to-digital converter. Experiments have proved that the use of polysilicon resistors to form the voltage-divider network of the successive approximation register analog-to-digital converter will cause the integral nonlinearity (INL) of the 16-bit successive approximation register analog-to-digital converter to rise to hundreds of least significant bits (LSB), and such a successive-approximation analog-to-digital converter has been unable to meet the demand of the application.

Based on this, the present disclosure provides a technical solution of linearization for a high-voltage polysilicon resistor voltage-divider network at the front end of a successive approximation register analog-to-digital converter. In this technical solution utilizing the characteristics of the silicon-on-insulator (SOI) process, the upper silicon substrate layer of the silicon-on-insulator substrate is divided into multiple insulating and isolated substrate isolation areas, a silicon oxide layer and a polysilicon resistor layer are sequentially formed on the upper silicon substrate layer, and the polysilicon resistor layer is divided into several polysilicon resistor blocks. These polysilicon resistor blocks are placed on several substrate isolation areas in a one-to-one correspondence so that the potential of the substrate isolation area closely follows the potential of the polysilicon resistor block. As a result, the polysilicon resistor blocks and the underlying substrate isolation areas cannot form a strong electric field. Therefore, the edge accumulation effect of the carriers is eliminated, which improves the linearity of a front-end resistor voltage-divider network of the successive approximation register analog-to-digital converter.

Embodiments of the present disclosure are described below through specific examples, and those skilled in the art can easily understand other advantages and effects of the present disclosure from the content disclosed in this specification. The present disclosure can also be implemented or applied through other different specific implementations, and various modifications or changes can be made to the details in this specification based on different viewpoints and applications without departing from the spirit of the present disclosure.

Please refer to FIG. 1 to FIG. 15. It should be noted that the diagrams provided in these embodiments only schematically illustrate the basic idea of the present disclosure. These drawings may only show the components related to the present disclosure and may not be drawn according to the number, shape, and scale of the components in actual implementation. The position, number, and scale of each component may be changed arbitrarily during actual implementation, and the configuration and type of the components may also be more complicated. The structure, scale, size, etc., shown in the drawings are only used to explain the content disclosed in the specification for the understanding and reading of those who are familiar with this technology and are not used to limit the conditions for the implementation of the present disclosure, so it has no technical substantive meaning, and any modification of structure, change of proportional relationship or adjustment of size shall still fall within the scope of the present disclosure without affecting the functions and objectives of the present disclosure.

As shown in FIG. 3 to FIG. 14, exemplary embodiments of the present disclosure provide a method for manufacturing a polysilicon resistor, and this method includes the following steps.

Figure 4:
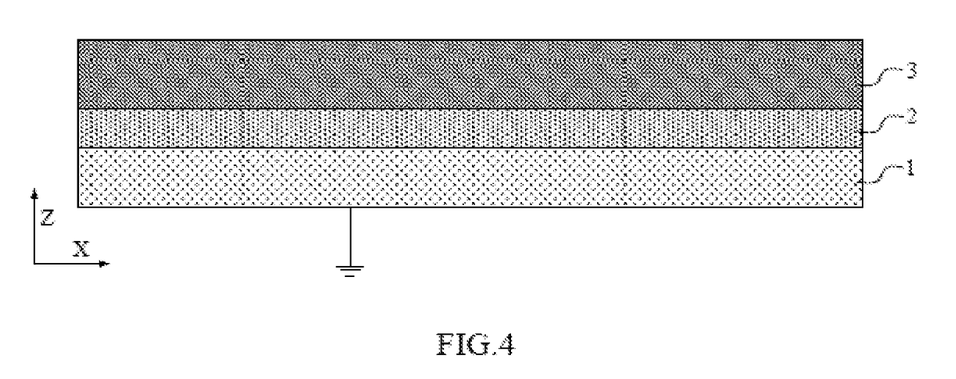
FIG. 4 to FIG. 14 are process flow diagrams of a method for manufacturing a polysilicon resistor according to exemplary embodiments of the present disclosure.

As shown in FIG. 4, step S1: providing a silicon-on-insulator substrate, wherein the silicon-on-insulator substrate includes a first silicon substrate 1, a first silicon oxide layer 2, and a second silicon substrate 3 that are sequentially stacked along a first direction (the positive direction of the Z-axis).

As shown in FIG. 5 to FIG. 8, step S2: forming an insulating isolation structure 4 on the silicon-on-insulator substrate, wherein the insulating isolation structure 4 extends through the second silicon substrate 3 along the first direction and divides the second silicon substrate 3 into a plurality of spaced substrate isolation areas 301, 302, 303, 304, 305.

Figure 9:
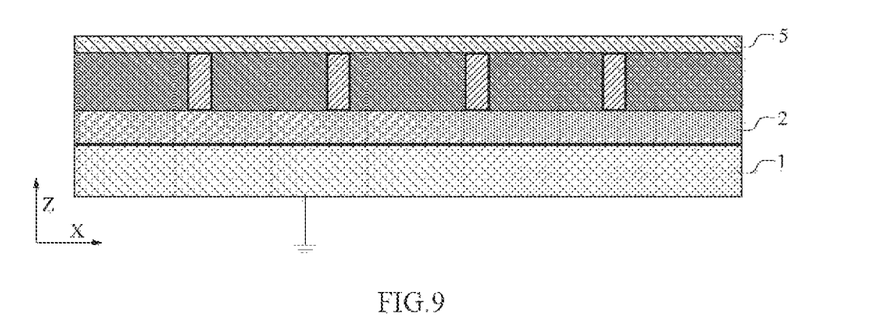

As shown in FIG. 9, step S3: forming a second silicon oxide layer 5 on the silicon-on-insulator substrate, wherein the second silicon oxide layer 5 covers the substrate isolation areas 301, 302, 303, 304, 305 and the insulating isolation structure 4.

As shown in FIG. 10 to FIG. 14, step S4: forming a polysilicon resistor layer on the second silicon oxide layer 5, wherein the polysilicon resistor layer includes spaced polysilicon resistor blocks 601, 602, 603, 604, 605, the polysilicon resistor blocks 601, 602, 603, 604, 605 are set in one-to-one correspondence with the substrate isolation areas 301, 302, 303, 304, 305, and the polysilicon resistor blocks 601, 602, 603, 604, 605 are connected in series.

As shown in FIG. 4, in step S1, the silicon-on-insulator substrate includes a first silicon substrate 1, a first silicon oxide layer 2 placed on the first silicon substrate 1, and a second silicon substrate 3 placed on the first silicon oxide layer 2.

In some exemplary embodiments, a silicon-on-insulator (SOI) is a new type of semiconductor material that uses a $SiO_2$ insulating layer to completely isolate a silicon device and a silicon substrate. It can be produced by various processes such as wafer bonding and oxygen ion implantation. The thickness of the buried oxide layer (BOX) in the silicon-on-insulator material obtained by wafer bonding can range from several hundred nanometers to more than 40 μm according to the requirements of the device. High-voltage integrated circuits and MEME devices generally require the thickness of the buried oxide layer to be greater than 200 nm, and the buried oxide layer is required to be dense. Therefore, in the present disclosure, the thickness of the buried oxide layer, i.e., the first silicon oxide layer 2 used in the front-end resistor voltage-divider network of the industrial successive approximation register analog-to-digital converter is relatively large, and the thickness of the first silicon oxide layer 2 is greater than 200 nm.

In some exemplary embodiments, as shown in FIG. 5 to FIG. 8, and FIG. 16, step S2 of forming the insulating isolation structure 4 on the silicon-on-insulator substrate further includes the following steps.

Figure 5:
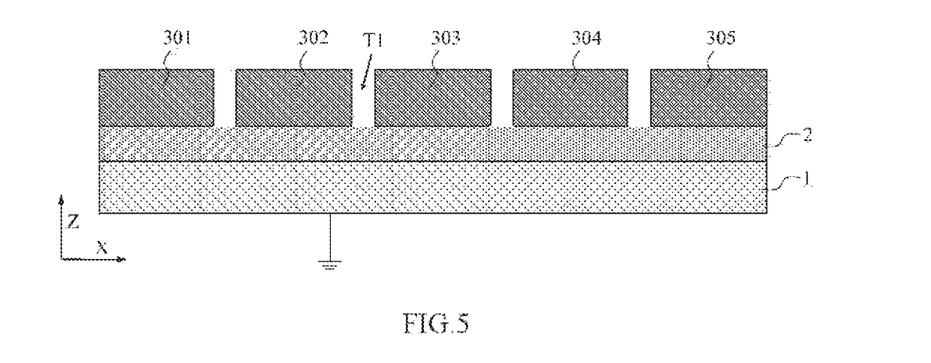
Figure 6:
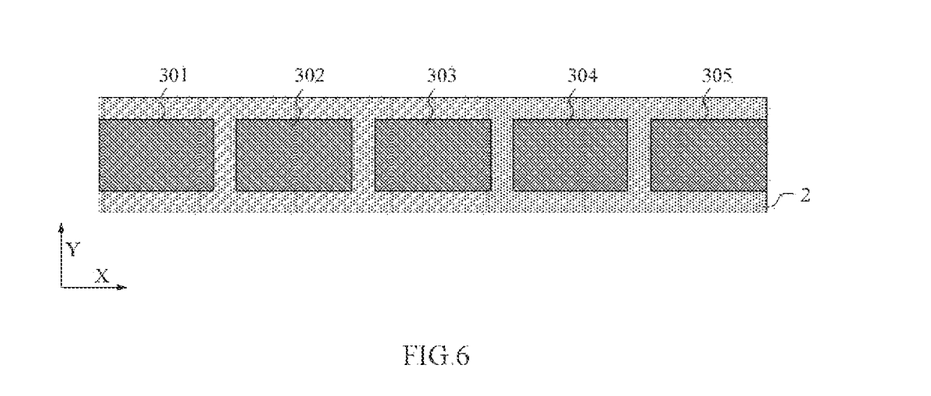

As shown in FIG. 5 to FIG. 6, step S21: forming an isolation trench T1 on the insulating silicon substrate, wherein the isolation trench T1 extends through the second silicon substrate 3 along the first direction, and the isolation trench T1 divides the second silicon substrate 3 into a plurality of spaced substrate isolation areas 301, 302, 303, 304, 305.

Figure 7:
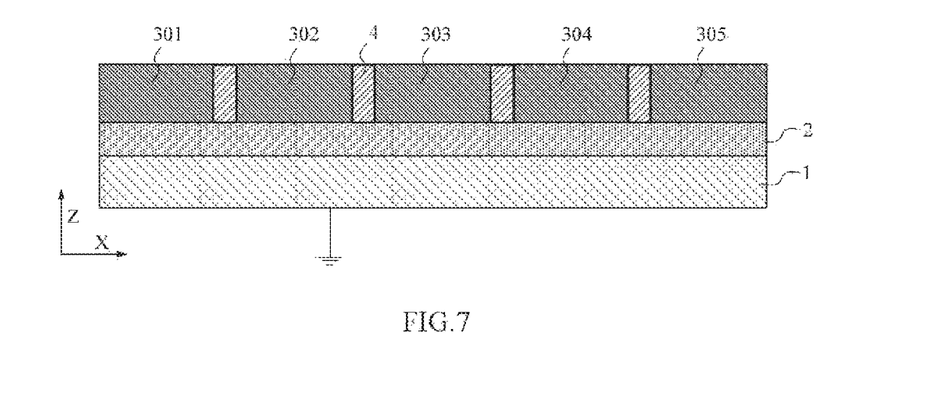
Figure 8:
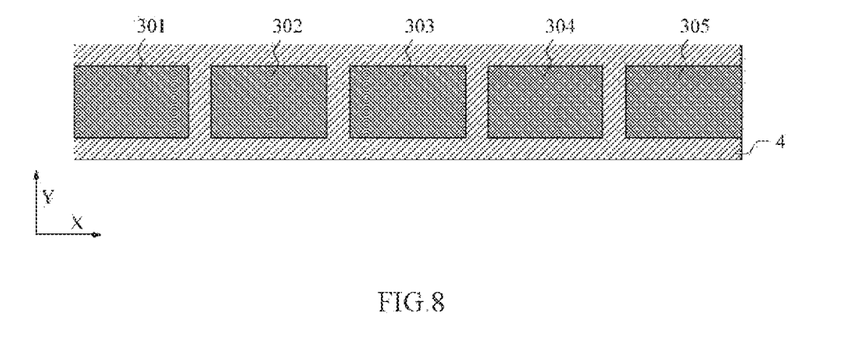

As shown in FIG. 7 to FIG. 8, step S22: filling the isolation trench T1 with an insulating material to obtain an insulating isolation structure 4.

In some exemplary embodiments, as shown in FIG. 5 to FIG. 6, in step S21, photolithography and etching are performed using a pre-set mask plate. For example, the second silicon substrate 3 is etched along the opposite direction of the first direction and penetrated such that the isolation trench T1 is formed in the second silicon substrate 3, and the isolation trench T1 divides the second silicon substrate 3 into substrate isolation areas 301, 302, 303, 304, 305 that are spaced at intervals.

In some exemplary embodiments, the specific details such as the shape and the number of the isolation trench T1 are not limited here. Meanwhile, only five substrate isolation areas are schematically drawn in FIG. 5 to FIG. 6. In fact, the number of substrate isolation areas is not limited to 5 and can be designed flexibly according to actual needs. In some exemplary embodiment of the present disclosure, it has been proved by experiments that at least the second silicon substrate 3 must be divided into 10 substrate isolation areas to meet the requirements of a 16-bit SAR ADC.

In some exemplary embodiments, as shown in FIG. 7 to FIG. 8, in step S22, the insulating isolation structure 4 is obtained by filling the isolation trench T1, which may be achieved by processes such as depositing an insulating material, performing surface planarization thereon, and so on. Physical isolation between the substrate isolation areas 301, 302, 303, 304, 305 is realized by the insulating isolation structure 4.

In some exemplary embodiments, as shown in FIG. 9, in step S3, the second silicon oxide layer 5 is formed on the silicon-on-insulator substrate, and the second silicon oxide layer 5 covers the substrate isolation areas 301, 302, 303, 304, 305 and the insulating isolation structure 4. The thickness of the second silicon oxide layer 5 is smaller than the thickness of the first silicon oxide layer 2, and the thickness of the second silicon oxide layer 5 is about 20 nm to 40 nm.

In some exemplary embodiments, as shown in FIG. 10 to FIG. 14, and FIG. 17, step S4 of forming the polysilicon resistor layer on the second silicon oxide layer 5 further includes the following steps.

Figure 10:
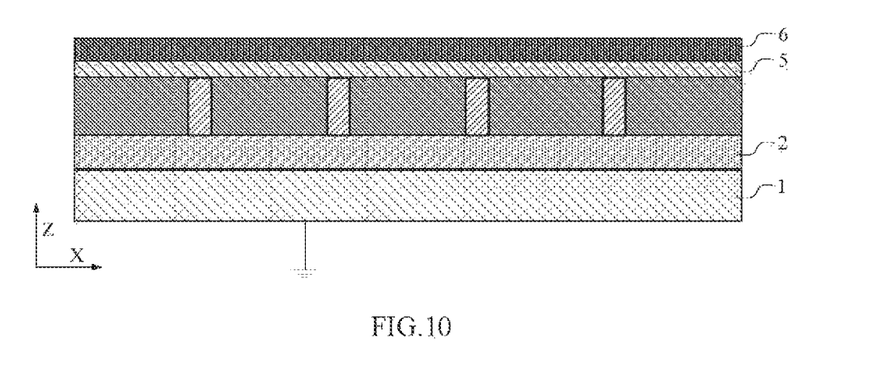

As shown in FIG. 10, step S41: forming a doped polysilicon material layer 6 on the second silicon oxide layer 5.

Figure 11:
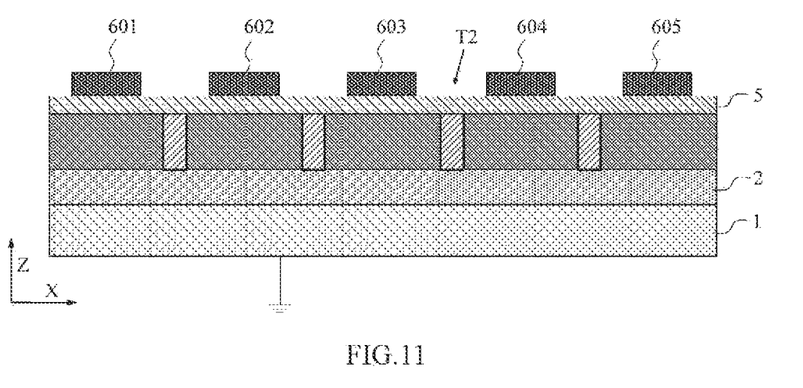
Figure 12:
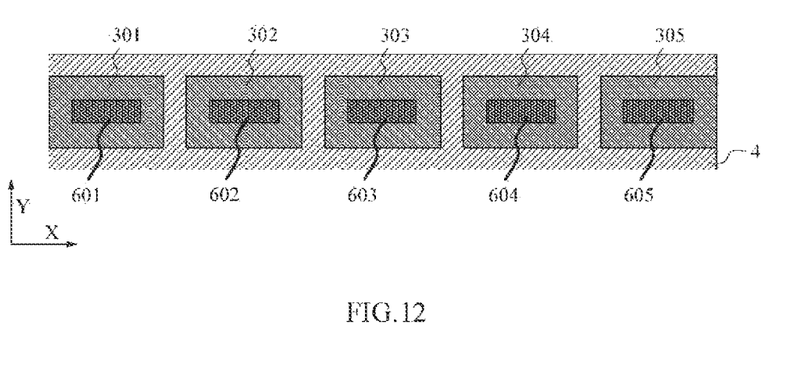

As shown in FIG. 11 to FIG. 12, step S42: etching the doped polysilicon material layer 6 to obtain separated polysilicon resistor blocks 601, 602, 603, 604, 605, wherein the polysilicon resistor blocks 601, 602, 603, 604, 605 are in one-to-one correspondence with the substrate isolation areas 301, 302, 303, 304, 305.

Figure 13:
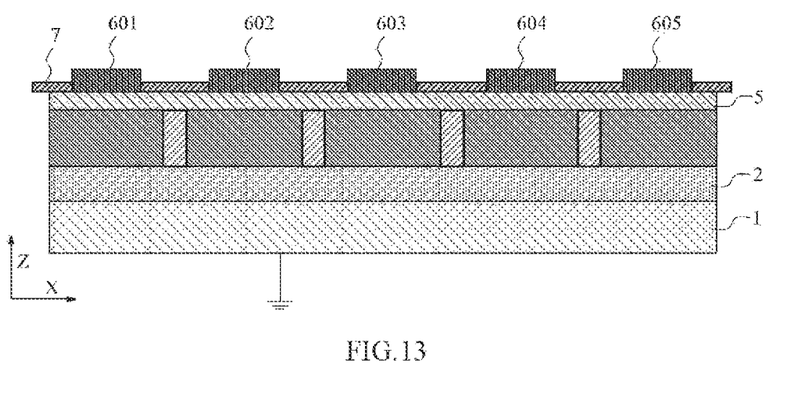
Figure 14:
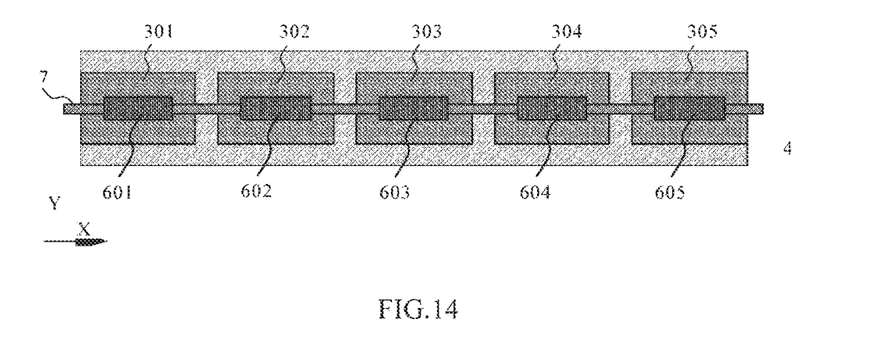

Step S43: connecting the polysilicon resistor blocks 601, 602, 603, 604, 605 in series in sequence to form a resistor string, and electrically leading out both ends of the resistor string.

In some exemplary embodiments, as shown in FIG. 10, in step S41, a polysilicon material layer is formed on the second silicon oxide layer 5, and then the polysilicon material layer is ion-doped to obtain a doped polysilicon material layer 6 as the body of the polysilicon resistor.

In some exemplary embodiments, the type and the concentration of the doped ions can be selected according to actual needs, and are not limited here.

In some exemplary embodiments, as shown in FIG. 11 to FIG. 12, in step S42, photolithography and etching are performed using a pre-set mask. The doped polysilicon material layer 6 is etched and penetrated along the opposite direction of the first direction, such that an isolation trench T2 is formed in the doped polysilicon material layer 6. The isolation trench T2 divides the doped polysilicon material layer 6 into separated polysilicon resistor blocks 601, 602, 603, 604, 605, and the polysilicon resistor blocks 601, 602, 603, 604, 605 are disposed with respect to the substrate isolation areas 301, 302, 303, 304, 305 in a one-to-one correspondence.

In some exemplary embodiments, FIG. 12 shows the top view after the second silicon oxide layer 5 is removed. As shown in FIG. 11 to FIG. 12, the polysilicon resistor blocks 601, 602, 603, 604, 605 are disposed with respect to the substrate isolation areas 301, 302, 303, 304, 305 in a one-to-one correspondence. For example, the polysilicon resistor block 601 is set corresponding to the substrate isolation area 301, the polysilicon resistor block 602 is set corresponding to the substrate isolation area 302, the polysilicon resistor block 603 is set corresponding to the substrate isolation area 303, the polysilicon resistor block 604 is set corresponding to the substrate isolation area 304, and the polysilicon resistor block 605 is set corresponding to the substrate isolation area 305.

In some exemplary embodiments, as shown in FIG. 13 to FIG. 14, in step S43, the polysilicon resistor blocks 601, 602, 603, 604, 605 are sequentially connected in series by the conductive metal 7 to form a resistor string, and two ends of the resistor string 7 are electrically led out by the conductive metal 7.

In some exemplary embodiments, FIG. 14 shows a top view after the second silicon oxide layer 5 is removed.

As shown in FIG. 13 to FIG. 14, a polysilicon resistor is finally manufactured according to the above-mentioned method. The polysilicon resistor includes a first silicon substrate 1, a first silicon oxide layer 2, a second silicon substrate 3, a second silicon oxide layer 5, and a polysilicon resistor layer.

In some exemplary embodiments, the first silicon oxide layer 2 is disposed on the first silicon substrate 1.

In some exemplary embodiments, the second silicon substrate 3 is disposed on the first silicon oxide layer 2, and an insulating isolation structure 4 is disposed in the second silicon substrate 3 and extends through the second silicon substrate 3. The insulating isolation structure 4 divides the second silicon substrate 3 into separated substrate isolation areas 301, 302, 303, 304, 305.

In some exemplary embodiments, the second silicon oxide layer 5 is disposed on the second silicon substrate 3 and covers the insulating isolation structure 4.

In some exemplary embodiments, the polysilicon resistor layer is arranged on the second silicon oxide layer 5 and includes separated polysilicon resistor blocks 601, 602, 603, 604, 605. The polysilicon resistor blocks 601, 602, 603, 604, 605 and the substrate isolation area 301, 302, 303, 304, 305 are set in one-to-one correspondence, and the polysilicon resistor blocks 601, 602, 603, 604, 605 are connected in series.

In some exemplary embodiments, the thickness of the first silicon oxide layer 2 is greater than the thickness of the second silicon oxide layer 5.

In some exemplary embodiments, as shown in FIG. 13 to FIG. 14, in the XY plane, the polysilicon resistor blocks 601, 602, 603, 604, 605 are distributed in a row in a straight line, and the specifications of the polysilicon resistor blocks 601, 602, 603, 604, 605 equal in size; and two adjacent polysilicon resistor blocks are electrically connected through the conductive metal 7 so that the polysilicon resistor blocks 601, 602, 603, 604, 605 are connected in series through the conductive metal 7 to form a resistor string. The two ends of the resistor string are electrically drawn out by the conductive metal 7.

It can be understood that the number of polysilicon resistor blocks is not limited to five, and the sizes and specifications of multiple polysilicon resistor blocks do not have to be exactly the same and can be flexibly designed.

Figure 15:
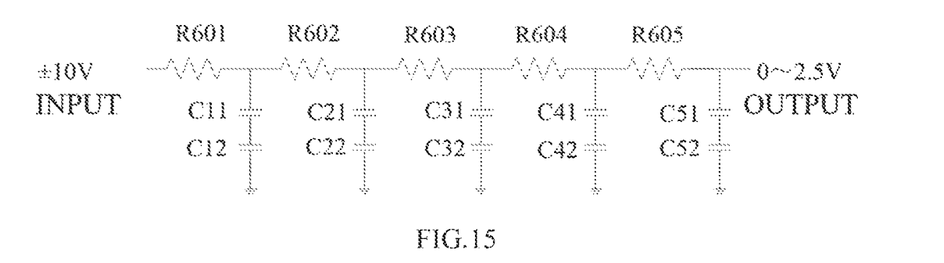
FIG. 15 shows an equivalent circuit diagram of polysilicon resistors in FIG. 13 to FIG. 14.
Figure 16:
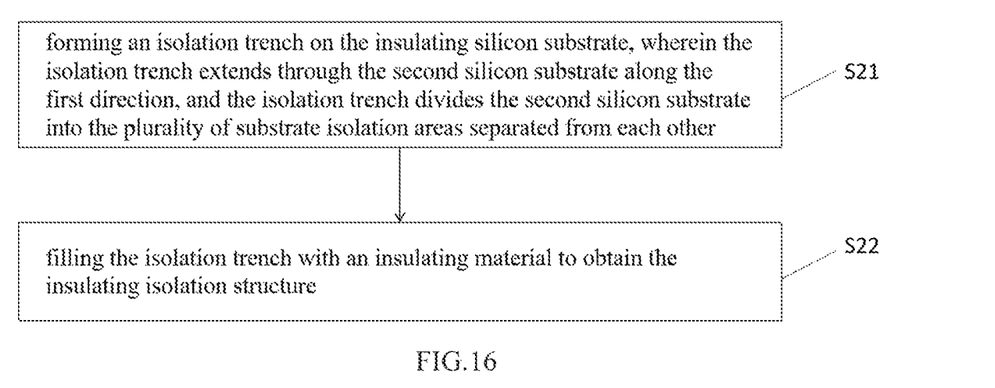
FIG. 16 is a flow chart showing the steps of forming an insulating isolation structure according to exemplary embodiments of the present disclosure.
Figure 17:
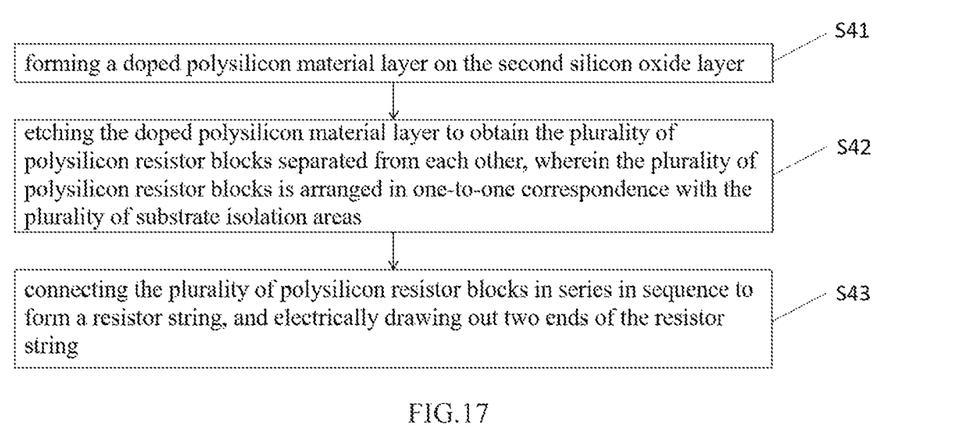
FIG. 17 is a flow chart showing the steps of forming a polysilicon resistor layer according to exemplary embodiments of the present disclosure.

In some exemplary embodiments, the equivalent circuit of the polysilicon resistor shown in FIG. 13 to FIG. 14 is shown in FIG. 15. Resistor R601 represents the resistance of the polysilicon resistor block 601. Capacitor C11 represents the resistance between the polysilicon resistor block 601 and the substrate isolation area 301. Capacitor C12 represents the capacitance between the substrate isolation area 301 and the first silicon substrate 1. Resistor R602 represents the resistance of the polysilicon resistor block 602. Capacitor C21 represents the capacitance between the polysilicon resistor block 602 and the substrate isolation area 302. Capacitor C22 represents the capacitance between the substrate isolation area 302 and the first silicon substrate 1. Resistor R603 represents the resistance of the polysilicon resistor block 603. Capacitor C31 represents the capacitance between the polysilicon resistor block 603 and the substrate isolation area 303. Capacitor C32 represents the capacitance between the substrate isolation area 303 and the first silicon substrate 1. Resistor R604 represents the resistance of the polysilicon resistor block 604. Capacitor C41 represents the capacitance between the polysilicon resistor block 604 and the substrate isolation area 304. Capacitor C42 represents the capacitance between the substrate isolation area 304 and the first silicon substrate 1. Resistor R605 represents the resistance of the polysilicon resistor block 605. Capacitor C51 represents the capacitance between the polysilicon resistor block 605 and the substrate isolation area 305. Capacitor C52 represents the capacitance between the substrate isolation area 305 and the first silicon substrates 1.

According to the design of actual process parameters, the thickness of the first silicon oxide layer 2 (more than 200 nm) is greater than or much greater than the thickness of the second silicon oxide layer 5 (20 nm to 40 nm), so that the capacitor C11 is much larger than the capacitor C12, the capacitor C21 is much larger than the capacitor C22, the capacitor C31 is much larger than the capacitor C32, the capacitor C41 is much larger than the capacitor C42, and the capacitor C51 is much larger than the capacitor C52. Therefore, the potential of the substrate isolation area 301 will closely follow the potential of the polysilicon resistor block 601, and the potential of the substrate isolation area 302 will closely follow the potential of the polysilicon resistor block 602, the potential of the substrate isolation area 303 will closely follow the potential of the polysilicon resistor block 603, and the potential of the substrate isolation area 304 will closely follow the potential of the polysilicon resistor block 604, and the potential of the substrate isolation area 305 will closely follow the potential of the polysilicon resistor block 605. That is, the potential of the substrate isolation area will closely follow the potential of the polysilicon resistor block so that no large electric field will be formed between the polysilicon resistor block and the substrate isolation area below, which will not cause the edge-accumulation effect.

Some exemplary embodiments of the present disclosure also provide a successive approximation register analog-to-digital converter, similar to FIG. 1. The successive approximation register analog-to-digital converter includes a resistor voltage-divider unit; a bandgap reference unit; and a successive approximation register analog-to-digital conversion unit.

In some exemplary embodiments, one end of the resistor voltage-divider unit is connected to an input voltage and the other end of the resistor voltage-divider unit is grounded. The resistor voltage-divider unit includes two polysilicon resistors connected in series, and the common end of the two polysilicon resistors outputs a sampling voltage.

In some exemplary embodiments, the bandgap reference unit outputs a reference voltage.

In some exemplary embodiments, the successive approximation register analog-to-digital conversion unit is connected to the resistance voltage-divider unit and the bandgap reference unit, respectively, and receives the sampling voltage and the reference voltage.

In some exemplary embodiments, the resistor voltage-divider unit is designed based on the above-mentioned polysilicon resistors, and thus the resistor voltage-divider unit will basically not cause the edge accumulation effect. Therefore, the linearity of the resistor voltage-divider unit is improved. The increase of the linearity of the resistor voltage-divider unit at the front end effectively decreases the integral nonlinearity (INL) of the back-end successive approximation register analog-to-digital conversion unit at the back end, which can meet the actual application requirements of the successive-approximation analog-to-digital converter.

In summary, the polysilicon resistor and its manufacturing method according to the exemplary embodiments of the present disclosure utilize the characteristics of the silicon-on-insulator (SOI) process to divide an upper silicon substrate layer of the silicon-on-insulator substrate into several insulated and isolated substrate isolation areas, and a silicon oxide layer and a polysilicon resistor layer are sequentially formed on the upper silicon substrate layer. The polysilicon resistor layer is divided into several polysilicon resistor blocks, and several polysilicon resistor blocks are disposed on several substrate isolation areas in one-to-one correspondence so that the potential of the substrate isolation area closely follows the potential of the polysilicon resistor block. Therefore, no strong electric field can be formed between the polysilicon resistor block and the underlying substrate isolation area, effectively eliminating the carrier edge accumulation effect on the polysilicon resistors. When polysilicon resistors are applied to a front-end resistor voltage-divider network of the successive approximation register analog-to-digital converter, the linearity of the resistor voltage-divider network can be effectively improved, thereby reducing the integral nonlinearity of the successive approximation register analog-to-digital converter and improving the accuracy of the successive approximating register analog-to-digital converter.

The above-mentioned embodiments only illustrate the principles and effects of the present disclosure but are not intended to limit the present disclosure. Anyone skilled in the art can modify or change the above-mentioned embodiments without departing from the spirit and scope of the present disclosure. Therefore, all equivalent modifications or changes made by those skilled in the art without departing from the spirit and technical ideas disclosed in the present disclosure shall still be covered by the claims of the present disclosure.

What is claimed is:
1. A polysilicon resistor, comprising:
 a first silicon substrate;

a first silicon oxide layer disposed on the first silicon substrate;

a second silicon substrate disposed on the first silicon oxide layer, wherein an insulating isolation structure is provided in the second silicon substrate, and the insulating isolation structure extends through the second silicon substrate and divides the second silicon substrate into a plurality of substrate isolation areas separated from each other;

a second silicon oxide layer disposed on the second silicon substrate; and a polysilicon resistor layer disposed on the second silicon oxide layer, wherein the polysilicon resistor layer includes a plurality of polysilicon resistor blocks separated from each other, the plurality of polysilicon resistor blocks is arranged in one-to-one correspondence with the plurality of substrate isolation areas, and the plurality of polysilicon resistor blocks is connected in series.

2. The polysilicon resistor according to claim 1, wherein the thickness of the first silicon oxide layer is greater than the thickness of the second silicon oxide layer.

3. The polysilicon resistor according to claim 1, wherein the plurality of polysilicon resistor blocks is arranged in a row, and adjacent polysilicon resistor blocks are electrically connected.

4. The polysilicon resistor according to claim 3, wherein the specifications and the size of the plurality of polysilicon resistor blocks are the same.

5. The polysilicon resistor according to claim 4, wherein the plurality of polysilicon resistor blocks is connected in series through a conductive metal to form a resistor string, and both ends of the resistor string are electrically drawn out through a conductive metal.

6. A method for manufacturing a polysilicon resistor, comprising:

providing a silicon-on-insulator substrate, wherein the silicon-on-insulator substrate includes a first silicon substrate, a first silicon oxide layer, and a second silicon substrate that are sequentially stacked along a first direction;

forming an insulating isolation structure on the silicon-on-insulator substrate, wherein the insulating isolation structure extends through the second silicon substrate along the first direction and divides the second silicon substrate into a plurality of substrate isolation areas separated from each other;

forming a second silicon oxide layer on the silicon-on-insulator substrate, wherein the second silicon oxide layer covers the plurality of substrate isolation areas and the insulating isolation structure; and forming a polysilicon resistor layer on the second silicon oxide layer, wherein the polysilicon resistor layer includes a plurality of polysilicon resistor blocks separated from each other, the plurality of polysilicon resistor blocks is arranged in one-to-one correspondence with the plurality of substrate isolation areas, and the plurality of polysilicon resistor blocks is connected in series.

7. The method according to claim 6, wherein forming the insulating isolation structure on the silicon-on-insulator substrate includes:

forming an isolation trench on the insulating silicon substrate, wherein the isolation trench extends through the second silicon substrate along the first direction, and the isolation trench divides the second silicon substrate into the plurality of substrate isolation areas separated from each other; and filling the isolation trench with an insulating material to obtain the insulating isolation structure.

8. The method according to claim 6, wherein the thickness of the second silicon oxide layer is smaller than the thickness of the first silicon oxide layer.

9. The method according to claim 7, wherein forming the polysilicon resistor layer on the second silicon oxide layer includes:

forming a doped polysilicon material layer on the second silicon oxide layer;

etching the doped polysilicon material layer to obtain the plurality of polysilicon resistor blocks separated from each other, wherein the plurality of polysilicon resistor blocks is arranged in one-to-one correspondence with the plurality of substrate isolation areas; and connecting the plurality of polysilicon resistor blocks in series in sequence to form a resistor string, and electrically drawing out two ends of the resistor string.

10. A successive approximation register analog-to-digital converter, comprising:

a resistor voltage-divider unit, wherein a first end of the resistor voltage-divider unit is connected to an input voltage and a second end of the resistor voltage-divider unit is grounded, and the resistor voltage-divider unit includes two polysilicon resistors arranged in series, and a common end of the two polysilicon resistors is configured to output a sampling voltage;

a bandgap reference unit configured to output a reference voltage; and a successive approximation register analog-to-digital conversion unit connected to the resistor voltage-divider unit and the bandgap reference unit and configured to receive the sampling voltage and the reference voltage, wherein each of the two polysilicon resistors includes:

a first silicon substrate;

a first silicon oxide layer disposed on the first silicon substrate;

a second silicon substrate disposed on the first silicon oxide layer, wherein an insulating isolation structure is provided in the second silicon substrate, and the insulating isolation structure extends through the second silicon substrate and divides the second silicon substrate into a plurality of substrate isolation areas separated from each other;

a second silicon oxide layer disposed on the second silicon substrate; and a polysilicon resistor layer disposed on the second silicon oxide layer, wherein the polysilicon resistor layer includes a plurality of polysilicon resistor blocks separated from each other, the plurality of polysilicon resistor blocks is arranged in one-to-one correspondence with the plurality of substrate isolation areas, and the plurality of polysilicon resistor blocks is connected in series.

11. The successive approximation register analog-to-digital converter according to claim 10, wherein the thickness of the first silicon oxide layer is greater than the thickness of the second silicon oxide layer.

12. The successive approximation register analog-to-digital converter according to claim 10, wherein the plurality of polysilicon resistor blocks is arranged in a row, and adjacent polysilicon resistor blocks are electrically connected.

13. The successive approximation register analog-to-digital converter according to claim 12, wherein the specifications and the size of the plurality of polysilicon resistor blocks are the same.

14. The polysilicon resistor according to claim 13, wherein the plurality of polysilicon resistor blocks is connected in series through a conductive metal to form a resistor string, and both ends of the resistor string are electrically drawn out through a conductive metal.

* * * * *